(12) United States Patent
DiCarlo et al.

(10) Patent No.: US 7,654,677 B2
(45) Date of Patent: Feb. 2, 2010

(54) YOKELESS HIDDEN HINGE DIGITAL MICROMIRROR DEVICE

(75) Inventors: Anthony DiCarlo, Richardson, TX (US); Patrick I. Oden, McKinney, TX (US); Richard L. Knipe, McKinney, TX (US); Rabah Mezenner, Richardson, TX (US); James D. Huffman, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/834,583

(22) Filed: Aug. 6, 2007

(65) Prior Publication Data

US 2007/0285757 A1    Dec. 13, 2007

Related U.S. Application Data

(62) Division of application No. 11/372,686, filed on Mar. 10, 2006, now Pat. No. 7,252,395, which is a division of application No. 10/298,423, filed on Nov. 18, 2002, now Pat. No. 7,011,415.

(60) Provisional application No. 60/332,332, filed on Nov. 21, 2001.

(51) Int. Cl.
   *G02B 26/08* (2006.01)
   *G02B 28/00* (2006.01)

(52) U.S. Cl. .................. 353/99; 359/291; 359/295; 348/771

(58) Field of Classification Search ............... 348/770, 348/771; 359/290–292, 846, 849, 850, 872, 359/876, 318, 198, 212, 213, 220–226, 295; 347/237; 353/98, 99
See application file for complete search history.

(56) References Cited

U.S. PATENT DOCUMENTS

| 5,111,693 A | 5/1992 | Greiff |
| 5,535,047 A | 7/1996 | Hornbeck |
| 5,583,688 A | 12/1996 | Hornbeck |
| 5,739,941 A | 4/1998 | Knipe et al. |
| 5,771,116 A | 6/1998 | Miller et al. |
| 5,867,202 A | 2/1999 | Knipe et al. |

(Continued)

FOREIGN PATENT DOCUMENTS

EP     0783124 A1     7/1997

(Continued)

*Primary Examiner*—William C Dowling
(74) *Attorney, Agent, or Firm*—Charles A. Brill; Wade James Brady, III; Frederick J. Telecky, Jr.

(57) ABSTRACT

A micromirror array 110 fabricated on a semiconductor substrate 11. The array 110 is comprised of three operating layers 12, 13, 14. An addressing layer 12 is fabricated on the substrate. A hinge layer 13 is spaced above the addressing layer 12 by an air gap. A mirror layer 14 is spaced over the hinge layer 13 by a second air gap. The hinge layer 13 has a hinge 13a under and attached to the mirror 14a, the hinge 13a permitting the mirror 14a to tilt. The hinge layer 13 further has spring tips 13c under the mirror 14a, which are attached to the addressing layer 12. These spring tips 13c provide a stationary landing surface for the mirror 14a.

20 Claims, 5 Drawing Sheets

U.S. PATENT DOCUMENTS

| | | | |
|---|---|---|---|
| 5,943,157 A * | 8/1999 | Florence et al. | 359/290 |
| 5,953,153 A * | 9/1999 | Conner et al. | 359/298 |
| 6,028,690 A | 2/2000 | Carter et al. | |
| 6,147,790 A * | 11/2000 | Meier et al. | 359/291 |
| 6,191,883 B1 | 2/2001 | Huffman et al. | |
| 6,285,490 B1 | 9/2001 | Meier et al. | |
| 6,323,982 B1 | 11/2001 | Hornbeck | |
| 6,798,560 B2 | 9/2004 | Aubuchon | |
| 6,856,446 B2 * | 2/2005 | DiCarlo | 359/291 |
| 6,870,660 B2 * | 3/2005 | DiCarlo | 359/291 |
| 7,011,415 B2 | 3/2006 | DiCarlo et al. | |
| 7,088,486 B2 * | 8/2006 | DiCarlo | 359/224 |
| 7,252,395 B2 | 8/2007 | DiCarlo et al. | |
| 7,411,713 B2 * | 8/2008 | DiCarlo | 359/224 |
| 7,483,199 B2 * | 1/2009 | DiCarlo | 359/291 |
| 2003/0095318 A1 * | 5/2003 | DiCarlo et al. | 359/291 |

FOREIGN PATENT DOCUMENTS

| | | |
|---|---|---|
| EP | 0980014 A1 | 2/2000 |
| EP | 1152277 A2 | 11/2001 |

* cited by examiner

YOKELESS HIDDEN HINGE DIGITAL MICROMIRROR DEVICE

This application is a Divisional of application Ser. No. 11/372,686, filed 10 Mar. 2006 now U.S. Pat. No. 7,252,395, which is a Divisional of application Ser. No. 10/298,423, filed 18 Nov. 2002 now U.S. Pat. No. 7,011,415, which claims the benefit of Provisional Application No. 60/332,332, filed 21 Nov. 2001.

RELATED APPLICATION

This application is related to application Ser. No. 10/317,474 filed Dec. 12, 2002 entitled "Digital Micromirror Device Having Mirror-Attached Spring Tips" now U.S. Pat. No. 6,856,446.

TECHNICAL FIELD OF THE INVENTION

This invention relates to micro-electromechanical devices and their fabrication, and more particularly to a digital micromirror device having an improved design.

BACKGROUND OF THE INVENTION

A Digital Micromirror Device™ (DMD™) is a type of microelectromechanical systems (MEMS) device. Invented in 1987 at Texas Instruments Incorporated, the DMD is a fast, reflective digital light switch. It can be combined with image processing, memory, a light source, and optics to form a digital light processing system capable of projecting large, bright, high-contrast color images.

The DMD is fabricated using CMOS-like processes over a CMOS memory. It has an array of individually addressable mirror elements, each having an aluminum mirror that can reflect light in one of two directions depending on the state of an underlying memory cell. With the memory cell in a first state, the mirror rotates to +10 degrees. With the memory cell in a second state, the mirror rotates to −10 degrees. By combining the DMD with a suitable light source and projection optics, the mirror reflects incident light either into or out of the pupil of the projection lens. Thus, the first state of the mirror appears bright and the second state of the mirror appears dark. Gray scale is achieved by binary pulsewidth modulation of the incident light. Color is achieved by using color filters, either stationary or rotating, in combination with one, two, or three DMD chips.

DMD's may have a variety of designs, and the most popular design in current use is a structure consisting of a mirror that is rigidly connected to an underlying yoke. The yoke in turn is connected by two thin, mechanically compliant torsion hinges to support posts that are attached to the underlying substrate. Electrostatic fields developed between the underlying memory cell and the yoke and mirror cause rotation in the positive or negative rotation direction.

The fabrication of the above-described DMD superstructure begins with a completed CMOS memory circuit. Through the use of six photomask layers, the superstructure is formed with alternating layers of aluminum for the address electrode, hinge, yoke, and mirror layers and hardened photoresist for sacrificial layers that form air gaps.

SUMMARY OF THE INVENTION

One aspect of the invention is an array of digital micromirror pixel elements. The array has a structure defined by three layers spaced from each other with an air gap between each layer. A mirror layer has a reflective mirror associated with each pixel element. A hinge layer is spaced under the mirror layer, and has a torsion hinge under each mirror and attached to the mirror such that the mirror may tilt above the hinge layer. An address layer is spaced under the hinge layer, and has circuitry for controlling operation of the pixel elements. The hinge layer further has spring tips under each mirror and mechanically connected to the address layer.

As stated in the Background, conventional DMD designs have a yoke under the mirror, at the hinge level. During operation, the yoke rather than the mirror lands on an underlying landing surface. The yoke has spring tips, used for landing. In the present invention, there is no yoke and the mirror lands on spring tips that are stationary under the mirror at the hinge level.

An advantage of the present invention is that the yoke structure of prior DMD designs is eliminated. This greatly simplifies the DMD structure, as well as its fabrication. Various patterning and etching steps associated with the yoke are eliminated. Fabrication of DMDs in accordance with the invention is expected to significantly increase the current DMD yield.

Also, as compared to previous DMD designs using a yoke, the mirror moves with reduced inertia. This permits faster mirror transition times.

DETAILED DESCRIPTION OF THE INVENTION

Figure 1:
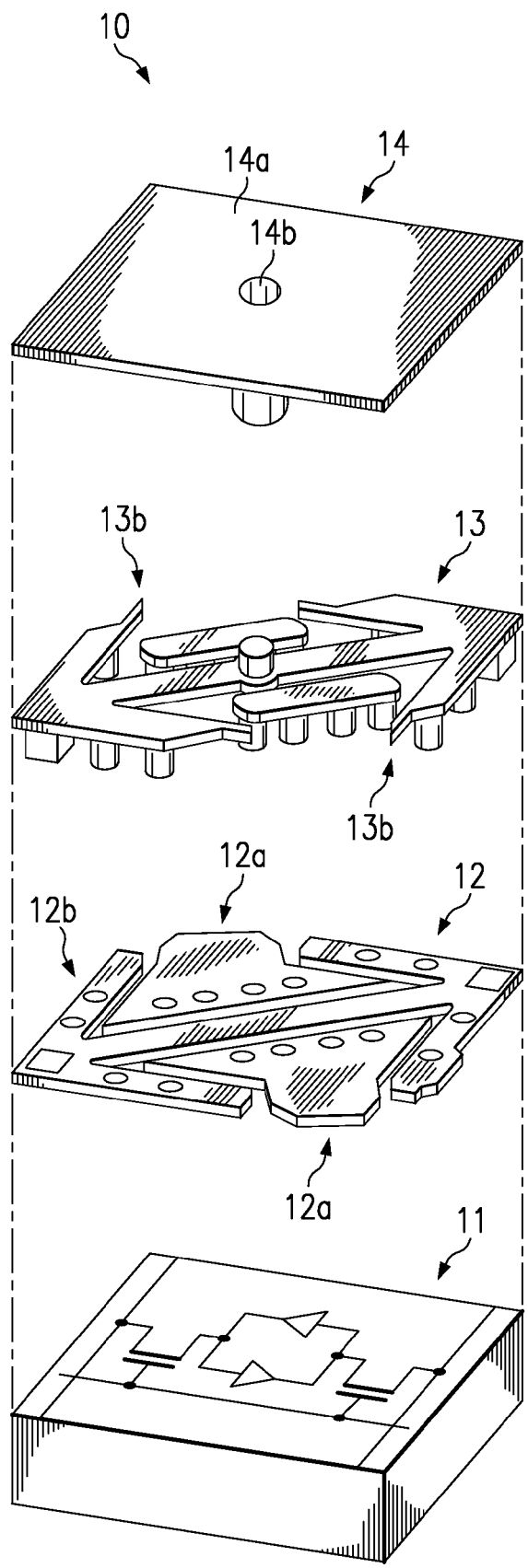
FIG. 1 is an exploded view of a DMD pixel element in accordance with the invention.

FIG. 1 is an exploded view of a DMD pixel element 10 in accordance with the invention. Pixel element 10 is one of an array of such elements fabricated on a wafer, using semiconductor fabrication techniques.

DMD pixel element 10 is a monolithically integrated MEMS superstructure cell fabricated over a CMOS SRAM cell 11. Two sacrificial layers (see FIGS. 2 and 10) have been removed by plasma etching to produce air gaps between three metal layers of the superstructure. For purposes of this description, the three metal layers are "spaced" apart by being separated by these air gaps.

The uppermost metal layer 14 has a reflective mirror 14a. The air gap under the mirror 14a frees the mirror 14a to rotate about a compliant torsion hinge 13a, which is part of the second metal layer 13. A third metal (M3) layer 12 has address electrodes 12a for the mirror 14a, the address electrodes 12a being connected to SRAM cell 11. The M3 layer 12 further has a bias bus 12b, which interconnects the mirrors 14a of all pixels to a bond pad at the chip perimeter. An off-chip driver supplies the bias waveform necessary for proper digital operation.

The DMD mirrors 14a are each 16 um square and made of aluminum for maximum reflectivity. They are arrayed on 17 um centers to form a matrix having a high fill factor (~90%). The high fill factor produces high efficiency for light use at the pixel level and a seamless (pixelation-free) projected image. The hinge layer 13 under the mirrors 14a permits a close spacing of the mirrors 14, and because of the underlying placement of the hinges, an array of pixel elements 10 is referred to as a "hidden hinge" type DMD architecture.

In operation, electrostatic fields are developed between the mirror 14a and its address electrodes 12a, creating an electrostatic torque. This torque works against the restoring torque of the hinge 13a to produce mirror rotation in a positive or negative direction. The mirror 14a rotates until it comes to rest (or lands) against spring tips 13c, which are part of the hinge layer 13. These spring tips 13c are attached to the addressing layer 12, and thus provide a stationary but flexible landing surface for the mirror 14a.

Figure 7:
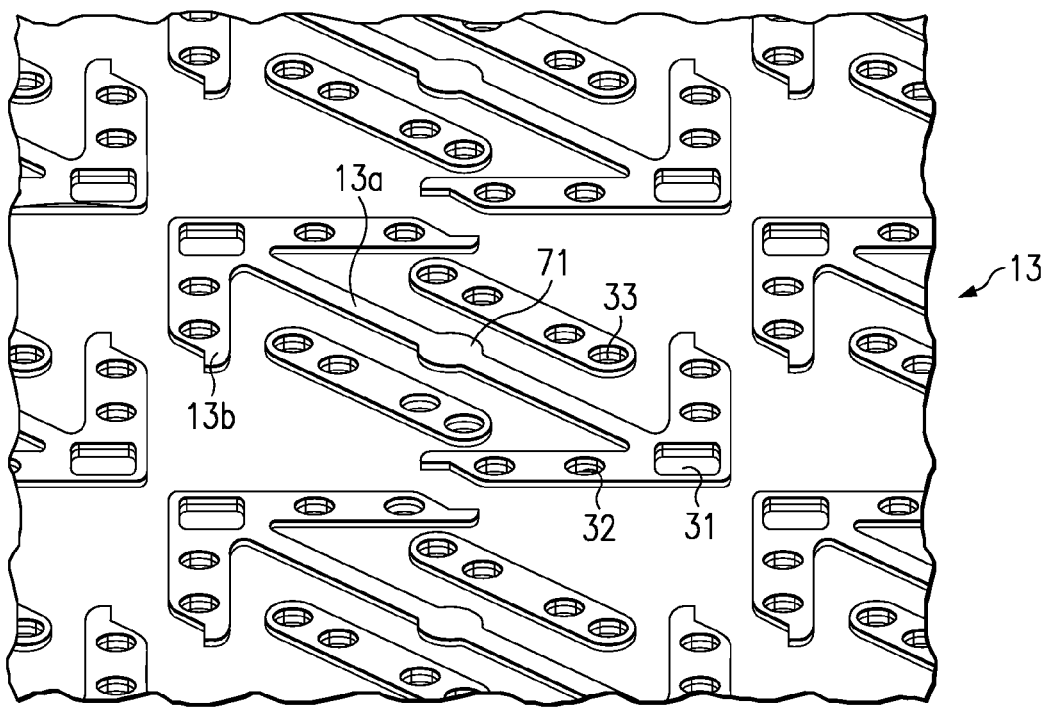
FIG. 7 is a perspective view of the surface of the hinge layer after patterning.

As shown in FIG. 1, address electrode 12a may comprise a lower portion and an upper or raised portion. In FIG. 1, the lower portion of the address electrode is formed in the third metal layer 12 while the upper portion is formed in second metal layer 13. As shown in FIGS. 1 and 7, the upper portion of the address electrode is located adjacent the hinge 13a and is supported by vias 33.

FIGS. 2-10 illustrate the DMD fabrication process. As explained below, this process follows conventional DMD fabrication up through deposition of a first spacer layer, S1.

Figure 2:
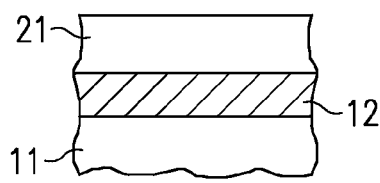
FIG. 2 is a cross sectional view of the layers of a DMD wafer through deposition and etching of a first spacer layer.

FIG. 2 is a cross sectional view of the layers of a DMD wafer through the deposition of the first spacer (S1) layer 21. The fabrication of the DMD superstructure begins with a completed CMOS memory circuit 11. Circuit 11 may be a conventional 5T or 6T SRAM cell. A thick oxide is deposited over the CMOS surface and then planarized, such as by using a chemical mechanical polish (CMP) technique. The CMP step provides a completely flat substrate for DMD superstructure fabrication.

Through the use of photomasking techniques, the M3 layer 12 is formed above the CMOS 11. This M3 layer 12 is formed with aluminum for address and bus circuitry. The aluminum is sputter-deposited and plasma-etched using plasma-deposited SiO2 as the etch mask. M3 layer 12 may be etched in a pattern used for DMD structures previously described in U.S. Pat. No. 6,028,690, entitled "Reduced Micromirror Gaps for Improved Contrast Ratio, and in U.S. Pat. No. 5,583,688, entitled "Multi-level Digital Micromirror Device", both assigned to Texas Instruments Incorporated. These patents are incorporated by reference herein.

A spacer layer 21, identified as S1, is then deposited over the M3 layer 11. Spacer layer 21 may be formed from hardened photoresist. Later in the packaging flow, this spacer layer 21 is plasma-ashed to form an air gap. A number of vias are then formed in spacer layer 21, formed by conventional pattern and etching techniques.

Figure 3:
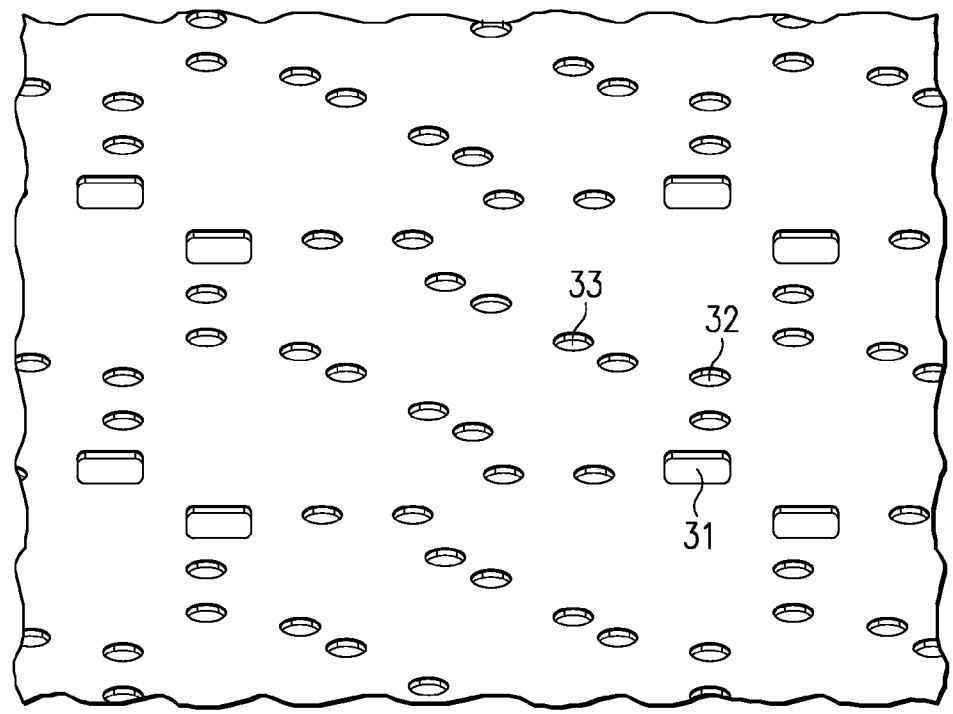
FIG. 3 is a perspective view of the surface of the first spacer layer.

FIG. 3 is a perspective view of the surface of the first spacer layer 21 after the vias have been formed. It illustrates spring tip support vias 31, hinge support vias 32, and electrode support vias 33.

Figure 4:
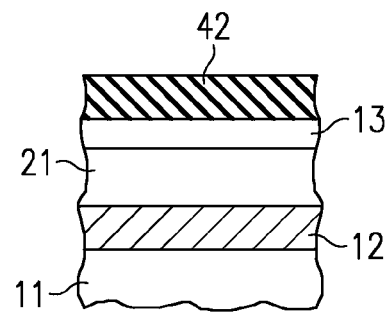
FIG. 4 is a cross sectional view of the layers of a DMD wafer through deposition of a hinge metal layer and oxide layer.
Figure 5:
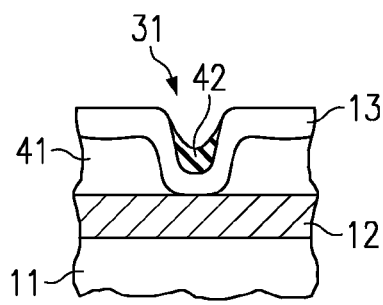
FIG. 5 is a cross sectional view of the layers of a DMD wafer through deposition and etching of a first spacer layer.
Figure 6:
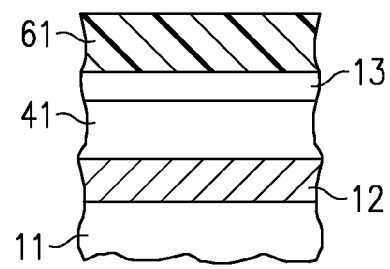
FIG. 6 is a cross sectional view of the layers of a DMD wafer through deposition of a hinge patterning layer.

FIGS. 4-6 illustrate fabrication of hinge layer 13. As explained below, hinge layer 13 contains both hinge 13a, spring tip beams 13b, and spring tips 13c extending from the spring tip beams 13b.

Referring to FIG. 4, the hinge layer 13 is formed by deposition of the hinge metal layer 13 and an oxide layer 42. The hinge metal is typically an aluminum alloy, such as AlTiO. An example of a suitable thickness for hinge layer 13 is 840 angstroms. An example of a suitable thickness for oxide layer 42 is 5000 angstroms.

FIG. 5 illustrates a portion of the partially fabricated DMD having a via 31, 32, or 33, and the result of a patterned etch process. The etch leaves an oxide coating within the vias 31, 32, or 33. The oxide at the bottom of the vias covers the thin metal at the bottom of each via, thereby providing strengthening. A develop rinse is then performed, or other cleanup to remove residue and prevent surface contamination. As an alternative to a patterned etch, a blanket etch could be used, which would tend to leave the oxide on the via side walls. As an alternative to oxide layer 42, a metal material rather than oxide could be deposited.

FIG. 6 illustrates the deposition and patterning of a hinge patterning layer 61. The patterning layer 61 is etched with a hinge etch mask in the pattern illustrated in FIG. 1. Then patterning layer 61 is chemically removed. The patterned hinge layer 13 is then descumed.

FIG. 7 is a perspective view of the surface of the patterned hinge layer 13. The various vias 31, 32, 33 are shown, as well as a hinge pad 71, upon which the mirror via 14a will end. Referring again to FIG. 1, the vias, now filled with deposited oxide material, form hollow support posts after the spacer layer 21 is removed. Two spring tips 13c are located under each of the two tilting corners of mirror 14a. In the embodiment of FIG. 7, the hinge 13a and spring tips 13b form a continuous pattern with the two spring tip beams 13b extending at an angle from each end of hinge 13a, but other patterns are possible. For example, one or two landing tips may be used, at a 45 degree or 90 degree angle orientation to the hinge.

Figure 8:
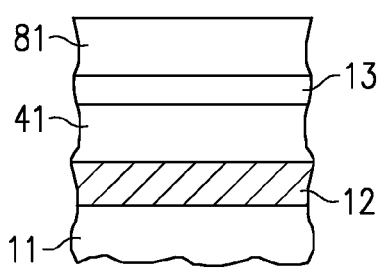
FIG. 8 is a cross sectional view of the layers of a DMD wafer through deposition of a second spacer layer.

FIG. 8 illustrates the deposition of second spacer (S2) layer 81. The mirror via 14a, illustrated in FIG. 1, is patterned and etched. The spacer resist is then cured and the surface descumed. A feature of the invention is that the gap between the mirror layer 14 and the hinge layer 13 can be reduced, as compared to conventional DMD designs. This reduces reflection off the hinge level in the gap, resulting in better image quality.

Figure 9:
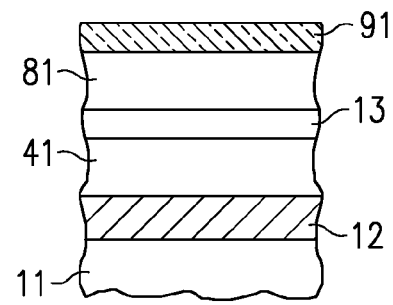
FIG. 9 is a cross sectional view of the layers of a DMD wafer through deposition of a mirror metal layer.

FIG. 9 illustrates deposition of metal mirror layer 91, from which mirror 14a is patterned. A typical thickness for mirror layer 91 is 3300 angstroms. The metal for mirror layer 91 is typically aluminum or an alloy of aluminum.

Figure 10:
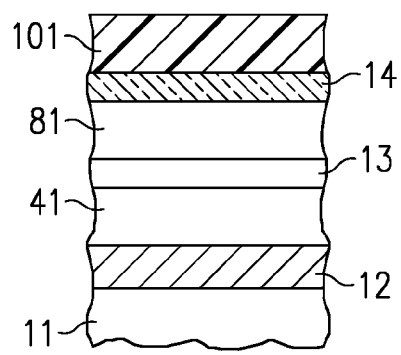
FIG. 10 is a cross sectional view of the layers of a DMD wafer through deposition of a mirror patterning layer.

FIG. 10 illustrates deposition of a mirror patterning layer 101, which is used to pattern mirror 14a. Mirror layer 14 is patterned and etched, leaving the mirror 14 of FIG. 1.

The packaging flow begins with the wafers partially sawed along the chip scribe lines to a depth that will allow the chips to be easily broken apart later. Before separating the chips from one another, each chip is tested for full electrical and optical functionality by a high-speed automated wafer tester. The chips are then separated from the wafer, and proceed to a plasma etcher that is used to selectively strip the organic sacrificial layers, S1 and S2, from under the mirror layer 14 and hinge layer 13. The chips are then plasma-cleaned, relubricated, and hermetically sealed in a package.

Figure 11:
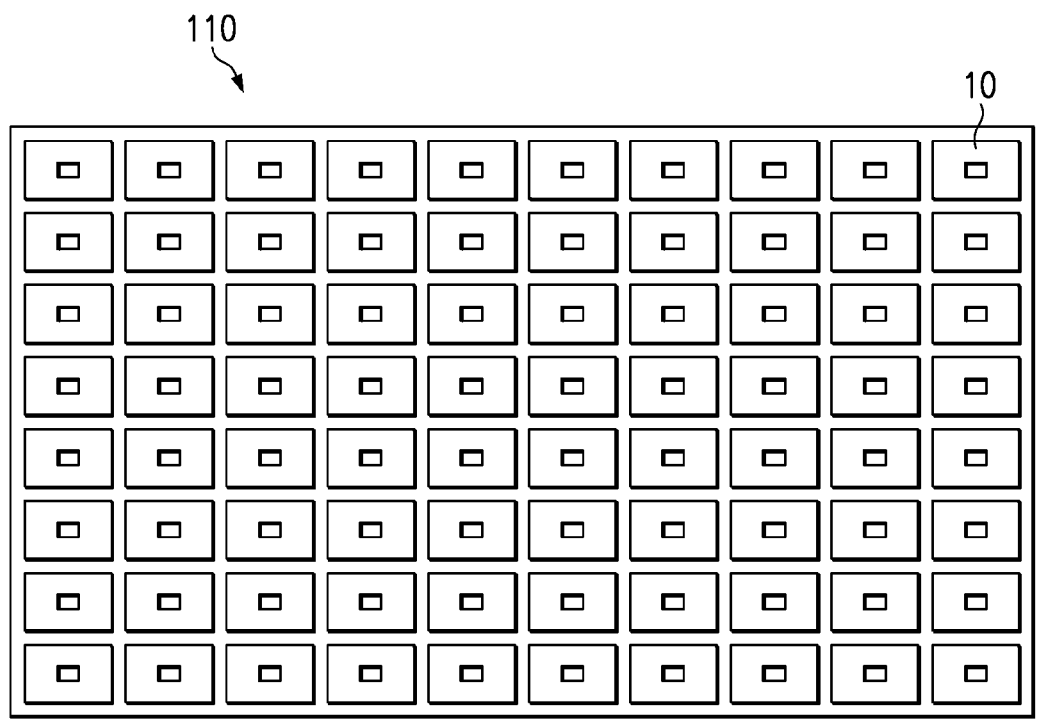
FIG. 11 is a top plan view of the mirror elements of a DMD array.

FIG. 11 is a top view of an array 110 of mirror elements 10. DMD arrays often have more than a thousand rows and columns of pixel elements 10. Packaged DMD chips are commercially available in various array sizes. For example, SVGA (800×600) and SXGA (1280×1024) arrays have been made. The diagonals of the active area are 0.7 inches and 1.1 inches, respectively.

The above-described design is a "diagonal" design, in which mirror 14 rotates around its diagonal. The same design can be easily modified to concepts can be applied to an "orthogonal" design, in which mirror 14 rotates around its flat sides.

Figure 12:
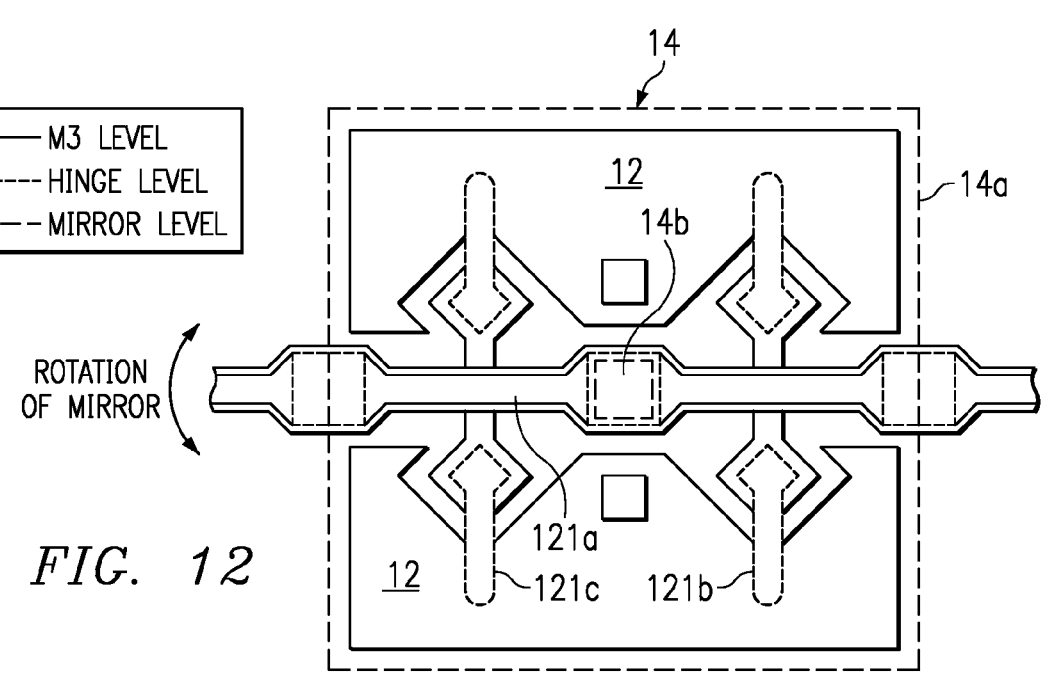
FIG. 12 illustrates the three layers of an orthogonal embodiment of the invention.

FIG. 12 illustrates addressing layer 120, hinge layer 121, and mirror layer 122 of an orthogonal DMD design. Three layers are shown with solid, dotted, and dashed lines, respectively. As an in the diagonal design described above, the hinge layer 121 has a hinge 121a, spring tip beams 121b, and spring tips 121c. An advantage of an orthogonal design is that a projection system using such DMDs can have reduced optical path lengths and thus a more compact size.

In operation, during landing, the torquing around the landed spring tip 13b reduces back torquing from the non landing tip 13b. This increases the tilt angle. A reset signal entering the bias line should not be required to initiate a transition. Bias potential and address voltages are expected to be sufficient to operate pixel 10, assuming that the time bias off parameter is sufficient for re-application of bias to achieve the desired transition. Because the spring tips 13b are at a radius closer to hinge 13a than is the case with conventional DMD designs, the effects of any holding torque due to stiction is reduced. Also, for purposes of the desired electrostatic operation, pixel 10 provides greater torque for a given pixel-electrode potential difference. This is due to having most of the active torque supplying areas of the address in electrodes and mirror placed as far out radially as possible. The hinge metal may be thicker due to increased electrostatic efficiency.

Figure 13:
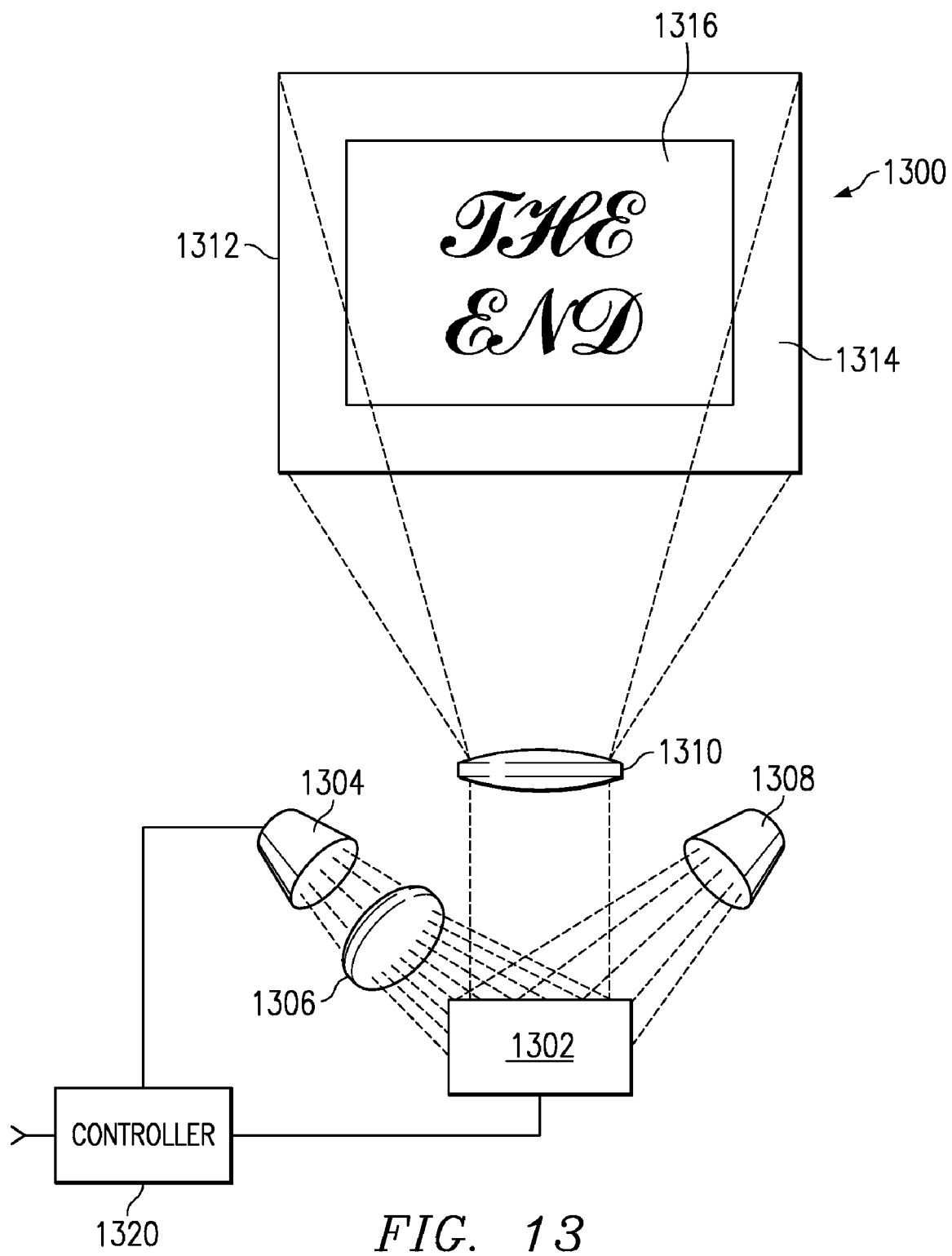
FIG. 13 is a schematic representation of a projection display system having a DMD array in accordance with the invention.

FIG. 13 is a schematic view of an image projection system 1300 having an improved micromirror device 1302 in accordance with the invention. Light from light source 1304 is focused on the micromirror device 1302 by lens 1306. Although shown as a single lens, lens 1306 is typically a group of lenses and mirrors which together focus and direct light from the light source 1304 onto the surface of the micromirror device 1302. Mirrors on the micromirror device that are rotated to an off position reflect light to a light trap 1308 while mirrors rotated to an on position reflect light to projection lens 1310, which is shown as a single lens for simplicity. Projection lens 1310 focuses the light modulated by the micromirror device 1302 onto an image plane or screen 1312. Mirrors in the exterior border region of micromirror device 1302 direct the light impinging on the border region to the light trap 1308, ensuring that the border region of the display 1314 is very dark and creating a sharp contrast with the interior image portion 1316 of the image plane. Controller 1320 provides timing and control signals for operating the pixel elements in the manner described above and in the referenced patents.

Other Embodiments

Although the present invention has been described in detail, it should be understood that various changes, substitutions, and alterations can be made hereto without departing from the spirit and scope of the invention as defined by the appended claims.

What is claimed is:

1. A micromechanical device comprising:
   a substrate;
   a hinge member spaced apart from said substrate;
   an electrode spaced apart from said substrate, said electrode comprising a lower portion and an upper portion spaced apart from said lower portion by a first distance, the upper portion spaced apart from said substrate by a second distance greater than the first distance; and
   a contact point spaced apart from said substrate, wherein said upper portion is closer to said hinge member than said contact point is to said hinge member.

2. The micromechanical device of claim 1 comprising a moveable member operable to contact said contact point upon movement of said moveable member.

3. The micromechanical device of claim 1, said contact point and said hinge member formed from a common layer.

4. The micromechanical device of claim 1, said hinge member and said upper portion formed from a common layer.

5. The micromechanical device of claim 1, said upper portion and said contact point formed from a common layer.

6. The micromechanical device of claim 1, wherein said electrode is operable to attract said moveable member.

7. The micromechanical device of claim 1, wherein the moveable member is a micromirror.

8. The micromechanical device of claim 1, wherein the device is a micromirror array.

9. A method of forming a micromirror device, the method comprising:
   providing a substrate;
   forming a hinge member spaced apart from said substrate
   forming a lower electrode portion spaced apart from said substrate;
   forming an upper electrode portion spaced apart from said lower electrode portion by a first distance, the raised electrode also spaced apart from said substrate by a second distance greater than the first distance; and
   forming a contact point spaced apart from said substrate, wherein said upper electrode portion is closer to said hinge member than said contact point is to said hinge member.

10. The method of claim 9 comprising forming a moveable member operable to contact said contact point upon movement of said moveable member.

11. The method of claim 9 comprising forming said contact point and said upper electrode portion from a common layer.

12. The method of claim 9 comprising forming said hinge member and said contact point from a common layer.

13. The method of claim 9 comprising forming said upper electrode portion and said hinge member from a common layer.

14. The method of claim 9 comprising forming said electrode operable to attract said moveable member.

15. The method of claim 9 wherein forming said moveable member comprises forming a micromirror.

16. A micromechanical device comprising:
   a substrate;
   an electrode having at least a portion spaced apart from said substrate;
   a limit structure spaced apart from said substrate;
   a hinge structure spaced apart from said substrate; and
   a deflectable member connected to said hinge and operable to deflect about an axis, said deflection limited by contact with said limit structure, wherein a distance between said portion of said electrode and said axis is less than a distance between said limit structure and said axis.

17. The micromechanical device of claim 16, wherein said hinge structure, said portion, and said limit structure are formed from a common layer.

18. The micromechanical device of claim 16, wherein said hinge structure is spaced apart from said substrate by a distance equal to a distance between said portion and said substrate.

19. The micromechanical device of claim 16, wherein said hinge structure is spaced apart from said substrate by a distance equal to a distance between said limit structure and said substrate.

20. The micromechanical device of claim 16, wherein said portion is spaced apart from said substrate by a distance equal to a distance between said limit structure and said substrate.

* * * * *